United States Patent [19]

Schaefer

[11] Patent Number: 4,635,057
[45] Date of Patent: Jan. 6, 1987

[54] REMOTE SENSOR WITH COMPENSATION FOR LEAD RESISTANCE

[75] Inventor: Maurice E. Schaefer, Tremont, Ill.
[73] Assignee: Caterpillar Inc., Peoria, Ill.
[21] Appl. No.: 748,081
[22] Filed: Jun. 24, 1985
[51] Int. Cl.[4] .............................................. G08C 19/04
[52] U.S. Cl. ............................... 340/870.39; 323/909
[58] Field of Search .............. 340/870.39, 856, 870.04, 340/870.16, 870.42; 73/765, 119 A; 374/172; 323/909

[56] References Cited

U.S. PATENT DOCUMENTS 4,205,327  5/1980  Dahlke ........................... 340/870.39

FOREIGN PATENT DOCUMENTS 2648635  1/1978  Fed. Rep. of Germany .
2710581  9/1978  Fed. Rep. of Germany .
2426908 12/1979  France .
2532759  9/1984  France .

OTHER PUBLICATIONS

Gosh, J., C-MOS Switches ... Cover Full 360°, from Electronics, vol. 52, No. 15, Jul. 19, '79, p. 70.

Primary Examiner—Jerry W. Myracle
Attorney, Agent, or Firm—Terry D. Morgan

[57] ABSTRACT

An apparatus increases the accuracy of a signal delivered from a remote analog sensor to an analog to digital converter. The output of the sensor is derived from a ratio between the power applied and the sensed parameter; thus, any changes to the power applied affects the accuracy of the sensor output. It is, therefore, advantageous to closely control the voltage applied to the sensor. The apparatus monitors the voltage drop across the lead lines which extend between the sensor and a power supply and increases the voltage applied to the sensor by a magnitude corresponding to the lead line voltage drop. The accuracy of the sensor is preserved independent of the lead line length and resistance.

12 Claims, 2 Drawing Figures

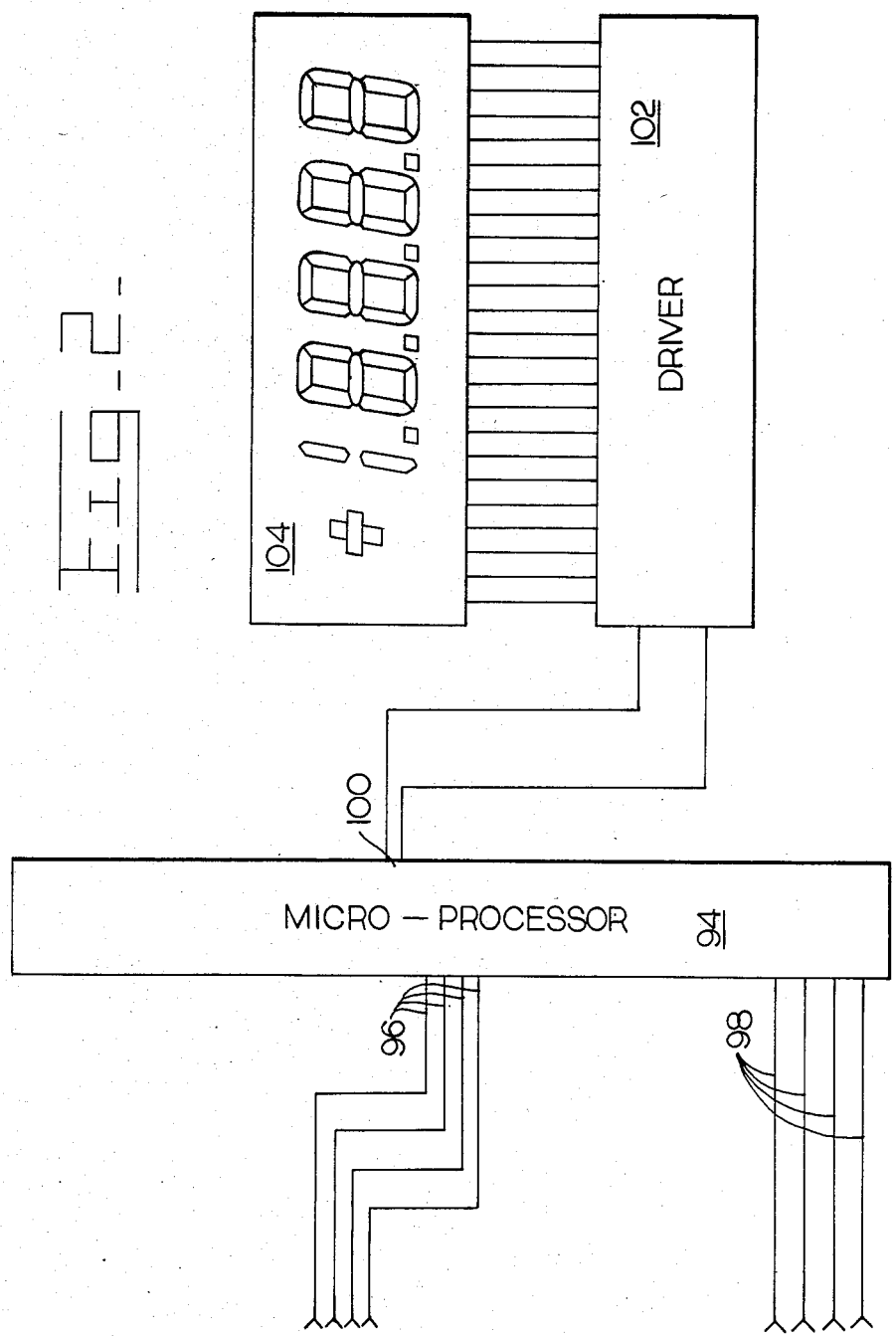

REMOTE SENSOR WITH COMPENSATION FOR LEAD RESISTANCE

DESCRIPTION

1. Technical Field

This invention relates generally to an interface circuit between a remote sensor and an analog to digital converter, and more particularly, to a circuit for increasing the accuracy of an A/D converter by compensating for the voltage drop across a lead line resistance.

2. Background Art

In the field of digital electronics, it is commonly necessary to monitor an operating parameter of a mechanical device. For example, digital electronic controllers are currently in use implementing control theory on internal combustion engines. To complete the necessary feedback loop in an engine control, potentiometers are typically used to monitor the position of a fuel controlling member such that the actual and desired positions may be compared by the controller and corrective actions implemented.

The environment associated with internal combustion engines is generally considered to be severe with respect to digital electronics and is not, therefore, a desirable location for the controller. The controller can be placed in a location remote from the engine; however, the sensor must necessarily be located on the engine and is typically connected to the controller via a wiring harness of considerable length. The signals delivered by the sensors over the wiring harness are typically analog voltage signals whose magnitude conveys information concerning the sensed parameter.

The wiring harness has a resistance that is primarily a function of the length thereof. Consequently, the longer the wiring harness, the greater the voltage drop, and the more significant the error in the magnitude of the voltage signal which is ultimately delivered to the controller. Corrections to the erroneous voltage signal have heretofore been made by estimating the voltage drop which occurs across a known length of wire of a standard cross section and material and factoring the correction into the signal by increasing the voltage at the source. These estimates are at best approximations due to the comparatively imprecise industry standards used in manufacturing commercial wiring harnesses. Such estimates preclude a generation of precise voltage signals indicative of the measured parameter as required by modern control theory. Moreover, the wiring harness will generally include a series of connectors, the resistance of which is a function of age, quantity of impurities, contact surface area, etc. Establishing an average resistance value for such connectors only serves to further reduce the accuracy of the voltage signal.

The present invention is directed to overcoming one or more of the problems as set forth above.

DISCLOSURE OF THE INVENTION

In accordance with one aspect of the present invention, an apparatus compensates for a voltage drop across a resistance of a first and second lead line where each of the first and second lead lines has first and second ends respectively connected between opposite terminals of a resistive type sensing element and the apparatus. The apparatus comprises a first means which senses the first lead line resistance and delivers a first voltage signal to the second end thereof. The first voltage signal has a magnitude responsive to the magnitude of the first lead line resistance. A second means senses the second lead line resistance and delivers a second voltage signal to the second end thereof. The magnitude of the second voltage signal is responsive to the second lead line resistance.

In electronic control systems, resistive type sensors have typically been remotely located from the control. Heretofore, known inaccuracies have existed due to the voltage drop across the lead lines interconnecting the sensor and control, but were considered inconsequential relative to the degree of achievable accuracy of the control itself. With the advent of increasingly complex control theory and more powerful microprocessor technology, these errors are now of significant proportion. The instant apparatus is directed to an interface circuit for adaptively compensating for the voltage drop across the lead line resistance.

BRIEF DESCRIPTION OF THE DRAWINGS

FIG. 2 illustrates a graphical representation of an electrical schematic of one embodiment of the present invention.

BEST MODE FOR CARRYING OUT THE INVENTION

Figure 1:
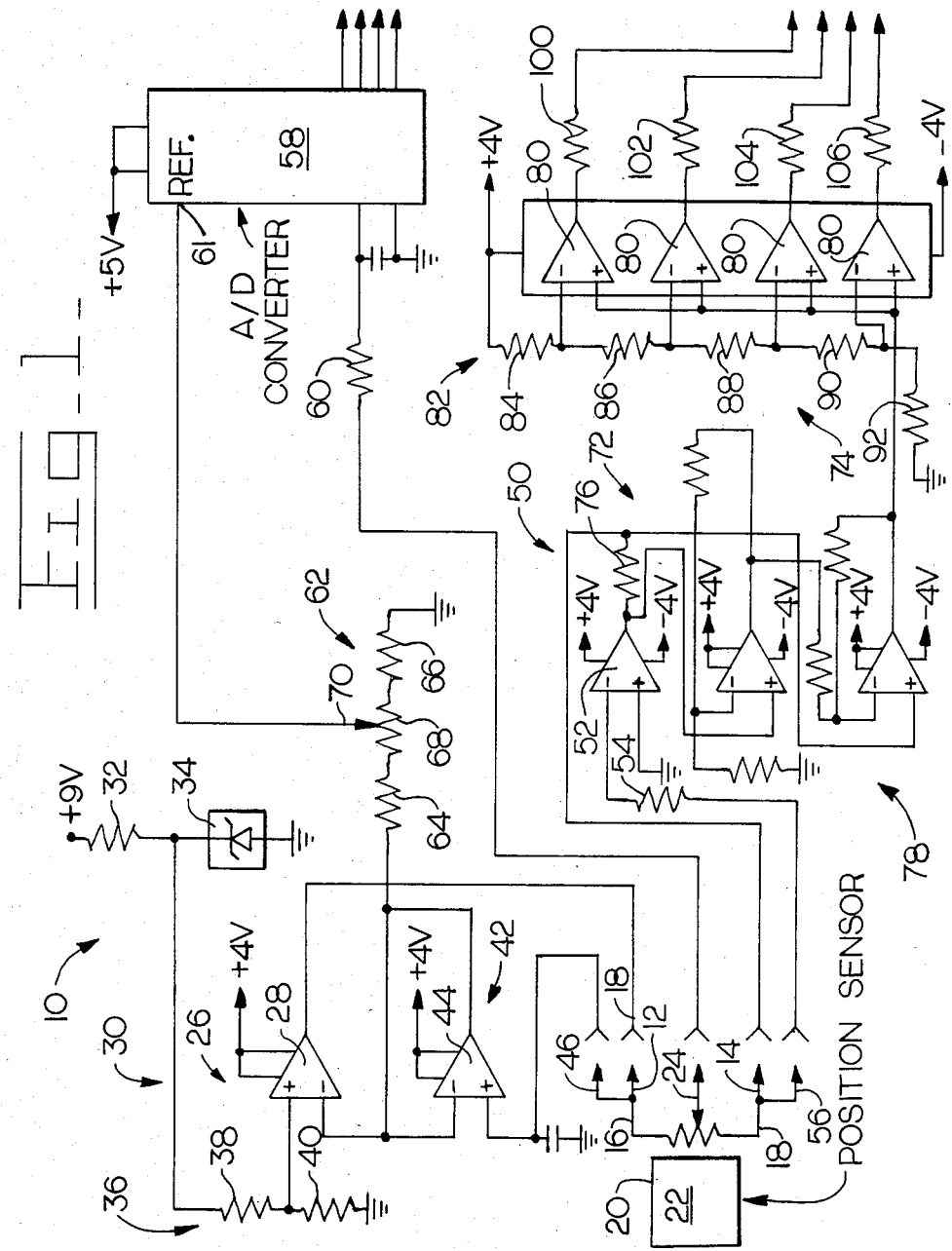
FIG. 1 illustrates a graphical representation of an electrical schematic of one embodiment of the present invention.

Referring now to the drawings, wherein a preferred embodiment of the present apparatus 10 is shown, FIG. 1 illustrates an electrical schematic of an apparatus 10 which compensates for a voltage drop across a resistance of a first and second lead line 12,14. The first and second lead lines 12,14 each have first and second ends connected between alternate terminals 16,18 of a resistive type sensing element 20 and the apparatus 10. In the preferred embodiment, the sensing element 20 is connected to a fuel controlling member, such as a rack of an internal combustion engine, and functions as a position sensor 22 to indicate the quantity of fuel being delivered to the engine. The position sensor 22 is typically a potentiometer connected to move with the rack and deliver an analog voltage signal on a tap 24 indicative of the position of the rack.

A first means 26 senses the magnitude of the resistance of the first lead line and delivers a first voltage signal to the second end of the first lead line 16. The first voltage signal has a magnitude responsive to the magnitude of the first lead line resistance. Preferably, the first voltage signal is positive and directly proportional to the magnitude of the first lead line resistance. The first means 26 includes a comparator 28 which has a noninverting input connected to a precision voltage source 30. The precision voltage source 30 comprises a +9 V supply connected through a current limiting resistor 32 to a reference voltage generating zener diode 34. A voltage divider network 36 is connected to the intersection of the zener diode 34 and current limiting resistor 32. The divider network 36 consists of a pair of serially connected 1% resistors 38,40. The combination of the ohmic value of the resistors 38,40 and the reference voltage generated by the zener diode 34 produces an accurate +1 V reference voltage at the connection between the resistors 38,40. The +1 V reference voltage is connected to the noninverting input of the comparator 28. The output of the comparator 28 is connected to the second end of the first lead line 12 such that power is delivered over the first lead line 12 to the position sensor 22.

A high impedance buffer circuit 42 has an input connected to the first end of the first lead line 12 and an output connected to the first means 26. The buffer circuit 42 includes a comparator 44 connected in a voltage follower arrangement with the output and inverting input interconnected and the noninverting input connected to the first end of the first lead line 12 via a third lead line 46. The output of the comparator 44 is also connected to the inverting input of the comparator 28 and thereby provides an analog voltage signal which has a magnitude proportional to the voltage drop across the position sensor 22. The resistive drop of the first lead line 12 and the position sensor 22 forms a voltage divider such that less than the full potential delivered by the comparator is received by the sensor 22. Thus, the tap output 24, being ratiometrically proportional to the voltage applied to the sensor 22, is significantly lower than the expected voltage. The comparator 28 compensates for the lead line voltage drop by comparing the +1 V reference to the actual voltage at the terminal 16 of the sensor 22. The comparator 28 will increase its output voltage until the voltage level at the terminal 16 rises to the +1 V reference level. The circuit attempts to maintain the voltage presented to the sensor 22 at +1 V irrespective of the voltage drop across the first lead line 12. Further, in the preferred embodiment, the lead line 12 is disconnectable at a connector 48 for ease of installation and maintenance. The connector 48 is responsible for introducing additional extraneous resistance into the circuit. The comparator 28 is insensitive to how the resistance is introduced and will act to maintain the voltage at the sensor 22 at +1 V. Use of the buffer circuit 42 is not necessary for the apparatus as described, but it has a separate utility which will be described in greater detail later in this specification. The second end of the third lead line 46 could be connected directly to the inverting input of the comparator 28. The input impedence of the comparators 28,44 is of a very large magnitude which limits current flow through the third lead line 46 to an insignificantly small value and causes the voltage drop across the third lead line resistance to be equally inconsequential. In this manner, the voltage at the terminal 16 is substantially equal to the voltage at the inverting input of the comparator 28. While the resistive values of the first and third lead lines 12,46 are similar in magnitude, the third lead line resistance is insignificant in comparison to the input impedance of the comparator 28, but the first lead line resistance is significant in comparison to the resistive value of the position sensor 22.

A second means 50 senses the magnitude of the resistance of the second lead line 14 and delivers a second voltage signal to the second end of the second lead line 14. The second voltage signal has a magnitude responsive to the magnitude of the second lead line resistance and in the preferred embodiment, the signal is negative and directly proportional to the magnitude of the second lead line resistance. The second means 50 includes a comparator 52 which has a noninverting input connected to system ground, an inverting input connected through a resistor 54 and a fourth lead line 56 to the first end of the second lead line 14. The output of the comparator 52 is connected to the second end of the second lead line 14 to provide a negative voltage signal to compensate for the voltage drop across the second lead line resistance. Operation of the second means 50 is similar but opposite in polarity to the operation of the first means 26. For example, to maintain the tap 24 voltage directly proportional to the +1 V reference voltage, the terminal 18 must be biased to system ground. The position sensor 22 and the second lead line resistance form a voltage divider which presents the voltage drop across the second lead line to the terminal 18 and increases the tap voltage by a corresponding magnitude. Due to the high impedance of the comparator 52, the voltage at the terminal 18 is delivered via the fourth lead line 56 to the inverting terminal of the comparator 52. The terminal 18 voltage is compared to system ground and a voltage is delivered by the comparator 52 which is equal in magnitude but negative in sign to the terminal 18 voltage. Resultingly, the terminal 18 is biased to system ground which maintains the tap voltage proportional to the +1 V reference and indicative of the true position of the sensor 22.

A conventional analog to digital converter 58 of the type commercially available from Intersil Corp. as part number ICL7135 is connected through an analog input to the tap 24 of the position sensor 22 via a current limiting resistor 60. Further, the converter 58 has a reference voltage input 61 and a parallel port digital output such that the value of the digital output is proportional to the ratio of the analog and reference voltage inputs. To further enhance the accuracy of the apparatus 10, the reference voltage is allowed to float to a level directly proportional to the voltage applied at the terminal 16 of the sensor 22 Because the system is of a dynamic nature, the voltage applied to the terminal 16 is in a constant state of flux. The comparator 28 constantly updates the output voltage based on the voltage detected at the terminal 16. Thus, the ratiometric effect of the analog to digital converter 58 cancels the inaccuracies introduced by the voltage drift at the terminal 16. The output of the comparator 44 is connected to system ground through a voltage divider network 62 which comprises a pair of resistors 64,66 and a potentiometer 68. The potentiometer 68 has a tap 70 connected to the reference input of the converter 58 to allow initial adjustment of the reference voltage input to a desired value.

The apparatus 10 includes circuitry for automatically detecting the type of position sensor 22 employed in a particular application. For example, if the same position detecting apparatus is to be implemented in a variety of applications, then allowance must be made for use of sensors 22 of varying construction. Sensors capable of different travel lengths are needed to operate on engines which have different rack stroke lengths. Sensors of different stroke lengths necessarily have different resistive values. Thus, to fully automate the apparatus 10, circuitry must be included to detect the magnitude of the resistance of the sensor 22 and correlate this information into the type of sensor 22 currently being used. One method of detecting the magnitude of the sensor resistance is to monitor the current flowing through the sensor 22. The resistance for a particular sensor 22 is fixed and the voltage applied is known to be +1 V; consequently, the current will be indicative of the type of sensor being used. A current sensing means 72 detects the magnitude of the current flowing between the output of the comparator 52 and the second end of the second lead line 14 and delivers a signal responsive to the magnitude of the current. A selector means 74 receives the current signal and delivers a signal responsive to the magnitude of the current signal for determining the resistive magnitude of the sensor 22.

The current sensing means 72 includes a resistor 76 connected between the output of the comparator 52 and the second end of the second lead line 14. A differential amplifier 78 has first and second inputs connected to opposite terminals of the current sensing resistor 76. The selector means 74 includes a plurality of comparators 80, where each of the comparators 80 has a noninverting input connected to an output of the differential amplifier 78 and an inverting input connected to one of a respective plurality of reference voltages of ascending preselected magnitudes. The reference voltages are generated by a voltage divider network 82 connected between +1 V and system ground. The network 82 has a plurality of serially connected resistors 84,86,88,90,92, the intersections of which are each connected to one of the comparators 80. In the illustrated embodiment, the apparatus 10 is shown to have four comparators 80 and is thereby capable of detecting four distinct types of position sensors 22. Those skilled in the art of electronic design will easily recognize that the application can be extended to detect any number of distinct sensors 22 by adding resistors to the voltage divider 82 and corresponding comparators 80.

FIG. 2 illustrates a conventional commercially available microprocessor 94 such as the variety provided by Motorola Corp. as part number MC146805E2P. The microprocessor 94 has two separate 4-bit parallel ports 96,98. The first input port 96 is connected to the 4-bit parallel output port of the analog to digital converter 58. The second port 98 is connected through current limiting resistors 100,102,104,106 (shown in FIG. 1) to the outputs of the comparators 80. The microprocessor 94 will, under software control, access the second port 98 to determine which of the comparators 80 is delivering a "high" signal and correlating this information into the magnitude of the sensor 22 resistance. Once the type of sensor 22 has been determined, then the software accesses a lookup table corresponding to that particular sensor 22. The lookup table is used to interpret the signals received on the first port 96 into positional information. For example, the signals on the first port 96 can be represented as binary numbers in the range 0000–1111 where 0000 is indicative of an initial starting position and 1111 represents maximum displacement. The remaining intermediate binary numbers represent various incremental positions within the full range of travel.

The microprocessor 94 is shown to have an output port 100 connected to a driver 102 which, in turn, is connected to a liquid crystal display 104. The display 104 provides a visual indication of the position of the sensor 22. The driver 102 and display 104 are only one type of output device and those skilled in the art of electronic design will readily recognize that the output port 100 could be connected to, for example, a driver of a stepper to control the position of a fuel controlling member of an internal combustion engine.

Industrial Applicability

In the overall operation of the apparatus 10, assume that the position sensor 22 is mounted on an internal combustion engine and connected to the rack of a fuel injection system to monitor the dynamic rack position. The circuitry illustrated in FIGS. 1 and 2 is contained within a hand held module and connected to the sensor 22 via a wiring harness having a length of approximately ten feet. The comparator 28 initially delivers a +1 V signal to the wiring harness. A voltage drop of an unknown magnitude will occur due to the internal resistance of the wiring harness which reduces the voltage actually applied to the first terminal 16 of the sensor 22. The actual voltage applied to the sensor 22 is delivered by the comparator 44 to both the comparator 28 and the reference input of the A/D converter. The comparator 28 responds by increasing the voltage by an amount corresponding to the voltage drop across the first lead line 12. This ensures that the actual voltage delivered to the sensor 22 is +1 V.

Similarly, the comparator 52 monitors the voltage level at the second terminal 18 of the sensor 22 and compares that voltage to system ground. The comparator 52 maintains the voltage level at the terminal 18 at 0 V by delivering a negative voltage signal equal in magnitude to the voltage drop across the second lead line 14. The comparators 28,52 interact to obtain a precise +1 V drop across the terminals 16,18 of the sensor 22 and thereby guarantee accurate positional information.

The A/D converter 58 receives an analog voltage signal from the tap 24 of the sensor 22 and converts the ratio of the tap voltage to the reference voltage to a 4-bit digital signal. Simultaneously, the magnitude of the current flowing through the sensor 22 is monitored by the differential amplifier 78 and delivered to the selector means 74. The selector means 74 converts the current magnitude into a 4-bit binary number indicative of the type of sensor currently being used.

The microprocessor 94 receives both 4-bit binary signals and correlates the signals under software control into a control signal which indicates the position of the rack of the fuel injection system. The actual position of the rack is then visually displayed on the liquid crystal display 104.

Other aspects, objects, and advantages of this invention can be obtained from a study of the drawings, the disclosure, and the appended claims.

I claim:

1. An apparatus for compensating for a resistance induced voltage drop across a first and a second lead line, each of said first and second lead lines having first and second ends respectively connected to opposite terminals of a resistive type sensing element and said apparatus, said apparatus comprising:

first means for sensing the magnitude of the resistance of said first lead line and delivering a first voltage signal to said second end of said first lead line, said first voltage signal having a magnitude responsive to the magnitude of said first lead line resistance; and second means for sensing the magnitude of the resistance of said second lead line and delivering a second voltage signal to the second end of said second lead line, said second voltage signal having a magnitude responsive to the magnitude of said second lead line resistance.

2. The apparatus, as set forth in claim 1, wherein the magnitude of said first voltage signal is positive and directly proportional to the magnitude of said first lead line resistance.

3. The apparatus, as set forth in claim 1, wherein the magnitude of said second voltage signal is negative and directly proportional to the magnitude of said second lead line resistance.

4. The apparatus, as set forth in claim 1, including:

a high impedance buffer circuit having an input connected to the first end of said first lead line and an output connected to said first means.

5. The apparatus, as set forth in claim 4, wherein said high impedance buffer circuit includes:
   a third lead line having a first and second end, said first end being connected to the first end of said first lead line; and
   a first comparator having an inverting and a noninverting input and an output, said noninverting input being connected to the second end of said third lead line, said output being connected to the inverting input.

6. The apparatus, as set forth in claim 5, wherein said first means includes:
   a second comparator having an inverting and a noninverting input and an output, said inverting input of said second comparator being connected to the output of said first comparator and said second comparator output being connected to said first lead line; and
   a precision voltage source connected to the noninverting input of said second comparator.

7. The apparatus, as set forth in claim 5, including:
   an analog to digital converter having an analog input, a digital output, and a reference voltage input;
   said resistive element sensor having a tap output connected to the analog input of said analog to digital converter; and
   said first comparator output being connected to the reference voltage input of said analog to digital converter.

8. The apparatus, as set forth in claim 1, wherein said second means includes:
   a fourth lead line having a first and second end, said first end being connected to the first end of said second lead line; and
   a third comparator having an inverting and a noninverting input and an output, said inverting input of said third comparator being connected to the second end of said second lead line, said noninverting input of said third comparator being connected to system ground, and said output of said third comparator being connected to the second end of said second lead line.

9. The apparatus, as set forth in claim 8, including:
   current sensing means for detecting the magnitude of the current flowing between said third comparator output and the second end of said second lead line and delivering a gauging signal responsive to the magnitude of said current; and
   selector means for receiving said gauging signal and delivering a signal responsive to the magnitude of said gauging signal.

10. The apparatus, as set forth in claim 9, wherein said current sensing means includes:
    a current sensing resistor connected between said third comparator output and said second end of said second lead line; and
    a differential amplifier having an output and first and second inputs, said inputs being connected to alternate terminals of said current sensing resistor.

11. The apparatus, as set forth in claim 9, wherein said selector means includes:
    a plurality of comparators, each having a noninverting input connected to the output of said differential amplifier, an inverting input connected to one of a respective plurality of reference voltages and an output.

12. An analog to digital conversion circuit having an interface circuit for automatically compensating for a voltage drop across a resistance associated with a lead line between a remotely located sensor having an input, an output, and a tap, and an analog to digital converter, comprising:
    said sensor having an input, an output, and a tap;
    a precision voltage source;
    a buffer having an output and a high impedance input connected to said sensor input;
    a first comparator having a noninverting input connected to said precision voltage source, an inverting input connected to the output of said buffer, and an output connected through said lead line to said sensor input;
    a second comparator having an inverting input connected to said output of said sensor, a noninverting input connected to system ground, and an output connected to said output of said sensor;
    an analog to digital converter having an input connected to the tap of said sensor and a reference voltage input connected to the output of said buffer;
    a current sensing resistor connected between the output of said second comparator and the output of said sensor;
    a differential amplifier having first and second inputs and an output, said first and second inputs being connected to alternate ends of said current sensing resistor;
    a plurality of comparators, each having a noninverting input connected to the output of said differential amplifier, an inverting input connected to a respective one of a plurality of reference voltages, and an output; and
    a processing means for receiving signals from the outputs of said analog to digital converter and said plurality of comparators and converting said signals to a control signal responsive to the magnitudes of said converter and comparator output signals.

* * * * *